(12) United States Patent
Lin

(10) Patent No.: US 6,753,223 B2
(45) Date of Patent: Jun. 22, 2004

(54) METHOD FOR FABRICATING FLASH MEMORY CELL

(75) Inventor: Chi-Hui Lin, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/295,260

(22) Filed: Nov. 15, 2002

(65) Prior Publication Data

US 2003/0124801 A1 Jul. 3, 2003

(30) Foreign Application Priority Data

Dec. 28, 2001 (TW) ........................................ 90132672 A (51) Int. Cl.⁷ ............................................. H01L 21/336
(52) U.S. Cl. ..................................... 438/257; 438/266
(58) Field of Search ................................ 438/257, 211, 438/261

(56) References Cited

U.S. PATENT DOCUMENTS 6,358,796 B1 * 3/2002 Lin et al. ..................... 438/257
6,486,032 B1 * 11/2002 Lin et al. ..................... 438/266
6,511,881 B1 * 1/2003 Lin ............................. 438/257
6,559,501 B2 * 5/2003 Sung et al. .................. 257/316
6,562,673 B2 * 5/2003 Lin ............................. 438/211
6,589,842 B2 * 7/2003 Huang ........................ 438/261

* cited by examiner

*Primary Examiner*—David Nelms
*Assistant Examiner*—Thao P. Le
(74) *Attorney, Agent, or Firm*—Quintero Law Office (57) ABSTRACT

A method for fabricating a flash memory cell. The method starts with sequential formation of a first insulating layer, a first conductive layer and pad layer on a semiconductor substrate. Part of the pad layer is removed to form a first opening, followed by forming a conductive spacer, i.e. the tip, on the sidewalls of the first opening. Then, parts of the pad layer, first conductive layer, first insulating layer and substrate are removed to form a second opening. Next, a second insulating layer is formed to fill the first opening and the second opening to form a first gate insulating layer and shallow trench isolation. The first gate insulating layer is used as hard mask to remove part of the first conductive layer and the first insulating layer to form a floating gate and a second insulating layer. Tunneling oxide and control gate are then formed on the floating gate. Finally, a source/drain is formed.

16 Claims, 14 Drawing Sheets

METHOD FOR FABRICATING FLASH MEMORY CELL

BACKGROUND OF THE INVENTION

1. Field of the Invention

The present invention relates to a method for fabricating a memory cell, in particular, a method for fabricating a flash memory cell.

2. Description of the Prior Art

Complementary metal oxide semiconductor (CMOS) memory is generally categorized into two groups: random access memory (RAM) and read only memory (ROM). RAM is a volatile memory, wherein the stored data disappears when power is off. On the contrary, turning off power does not affect the stored data in a ROM.

In the past few years, market share of ROM has been continuously expanding, and the type attracting the most attention has been flash memory. The fact that a single memory cell is electrically programmable and multiple memory cell blocks are electrically erasable allows flexible and convenient application superior to electrically programmable read only memory (EPROM), electrically erasable programmable read only memory (EEPROM) and programmable read only memory (PROM). Furthermore, fabricating flash memory is cost effective. Having the above advantages, flash memory has been widely applied in consumer electronic products, such as digital cameras, digital video cameras, mobile phones, notebooks, personal stereos and personal digital assistants (PDA).

Since portability of these electrical consumer products is strongly prioritized by consumers, the size of the products must be minimal. As a result, capacity of flash memory must increase, and functions must be maximized while sizes thereof are continuously minimized. Having an increased amount of access data, capacity of memory cells has been enhanced from 4 to 256 MB, and even 1 GB will become the market trend in the near future. Masks are essential in conventional processes for fabricating flash memory, even for the most critical process of floating gate and control gate.

Figure 1A:
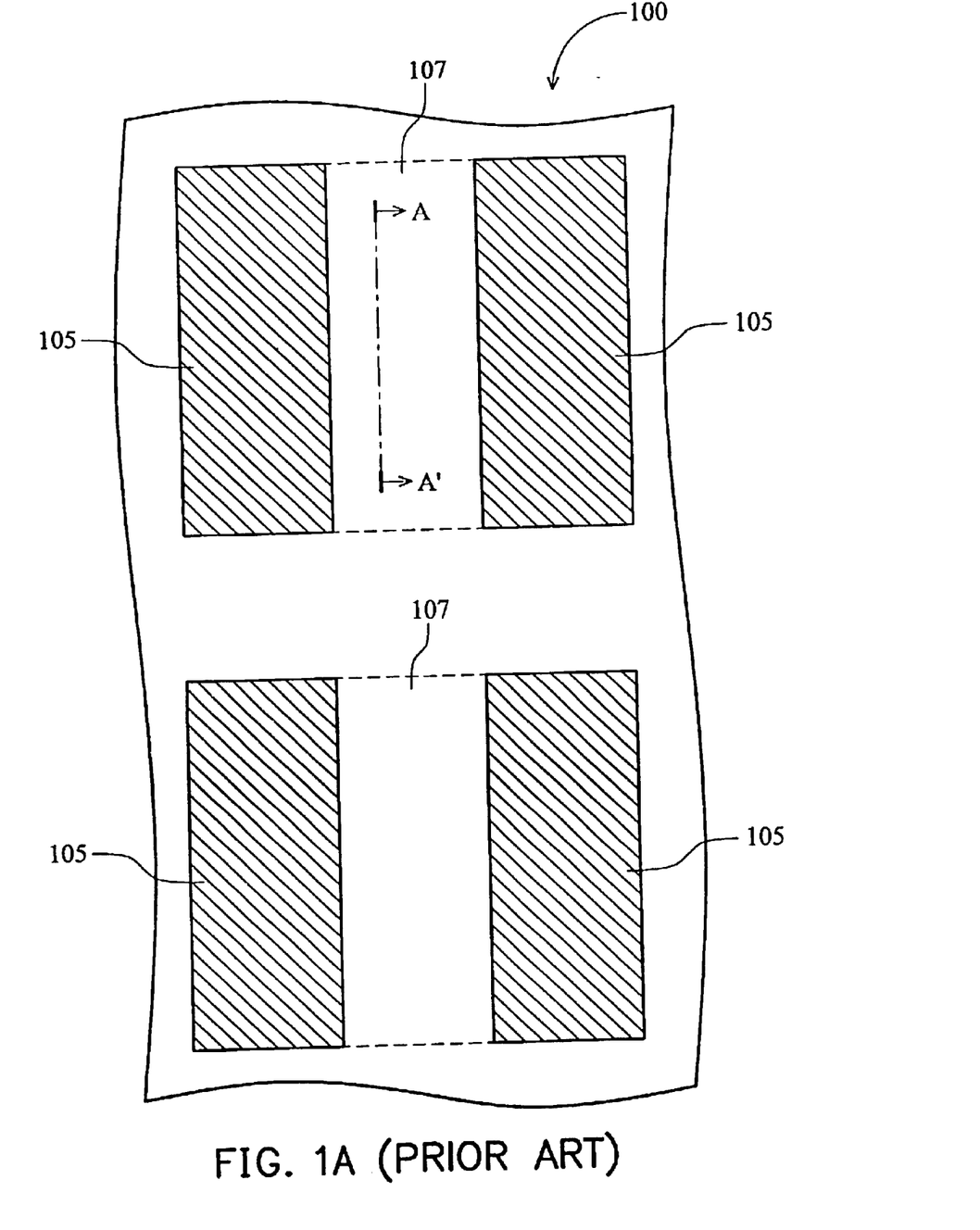
FIGS. 1A~1H are cross-sections of a conventional process of fabricating a flash memory cell.

Conventional process for a split gate flash memory cell is further explained with references to FIGS. 1A~1H. In FIG. 1A, using a p type substrate 100 as an example, local oxidation (LOCOS) is used to form a field isolation region 105. An active area 107 is separated from the field isolation region.

Figure 1B:
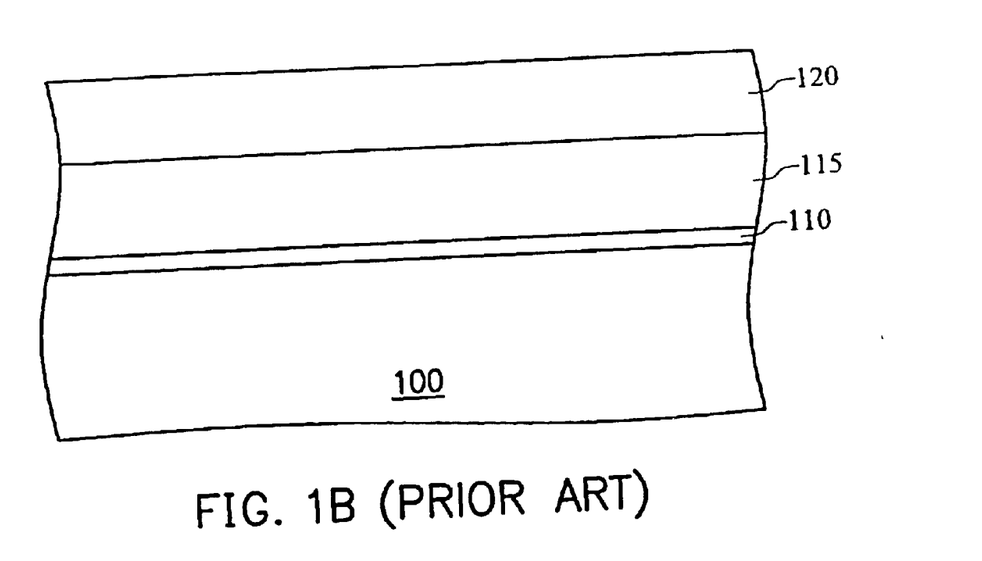

FIG. 1B is a cross-section taken from line A–A' in FIG. 1A. On the surface of the substrate 100 within the active area 107, silicon oxide is used to form a first insulating layer 110. Next, polysilicon is deposited by chemical vapor deposition on the first insulating layer 110. Suitable amount of dopant is doped in the polysilicon to form a first conductive layer 115. Then, silicon nitride is deposited on the first conductive layer 115 to form a first masking layer 120, used as hard mask in the following step.

Figure 1C:
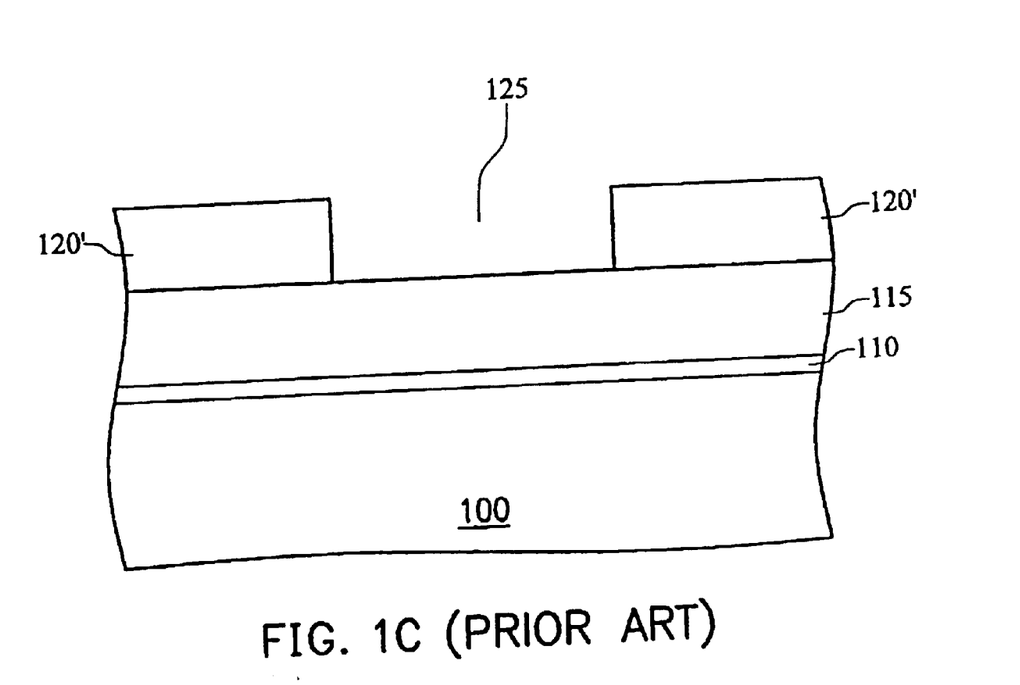

Part of the first masking layer 120 is removed to define a first opening 125 and to expose the surface of the first conductive layer 115, as shown in FIG. 1C. The first masking layer 120 remaining is represented by the remaining first masking layer 120'.

Figure 1D:
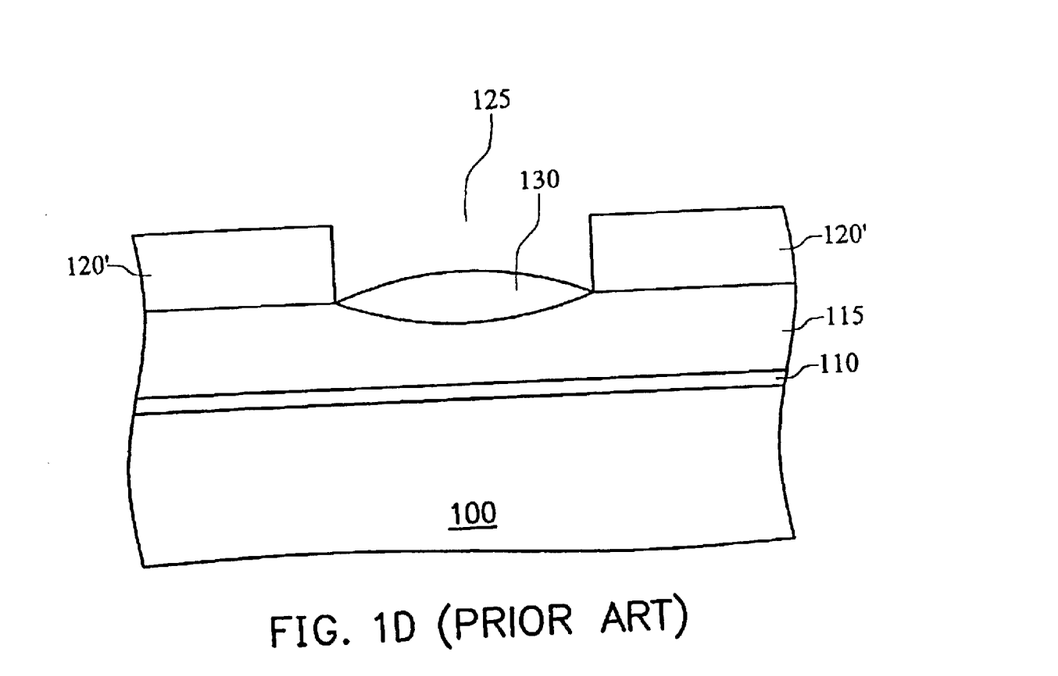

Oxidation is then performed to transform the surface of the exposed first conductive layer 115 to a floating gate oxide 130, as shown in FIG. 1D.

Figure 1E:
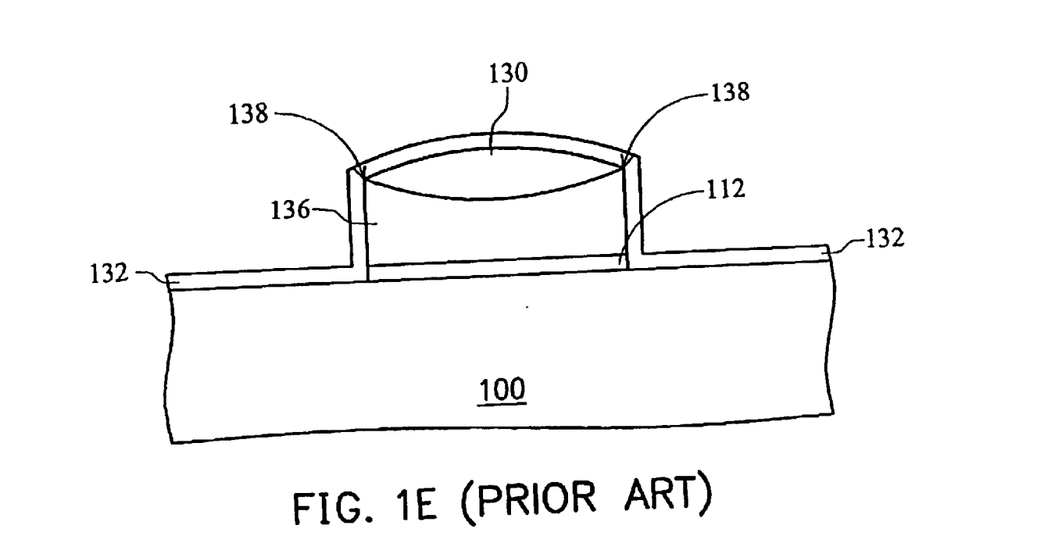

In FIG. 1E, isotropic etching is used to remove the first masking layer 120, followed by using the floating gate oxide 130 as a hard mask to carry out anisotropic etching. At this step, part of the first conductive layer 115 and the first insulating layer 110 are removed, leaving the first conductive layer 115 and the first insulating layer 110 underneath the floating gate oxide 130, and exposing the surface of the substrate 100. The remaining first conductive layer 115 forms the floating gate 136, and the remaining first insulating layer 110 is represented by first gate insulating layer 112. Poly tip 138 is formed when forming the floating gate 136, and this poly tip 138 is to discharge the floating gate 136 when erasing memory in the flash memory. Next, chemical vapor deposition is used to form a second insulating layer 132, silicon oxide covering the substrate 100, the surface of the floating gate oxide 130, the floating gate 136 and the sidewalls of the first gate insulating layer 112. Thickness of the second insulating layer 132 is 100~250 angstroms.

Figure 1F:
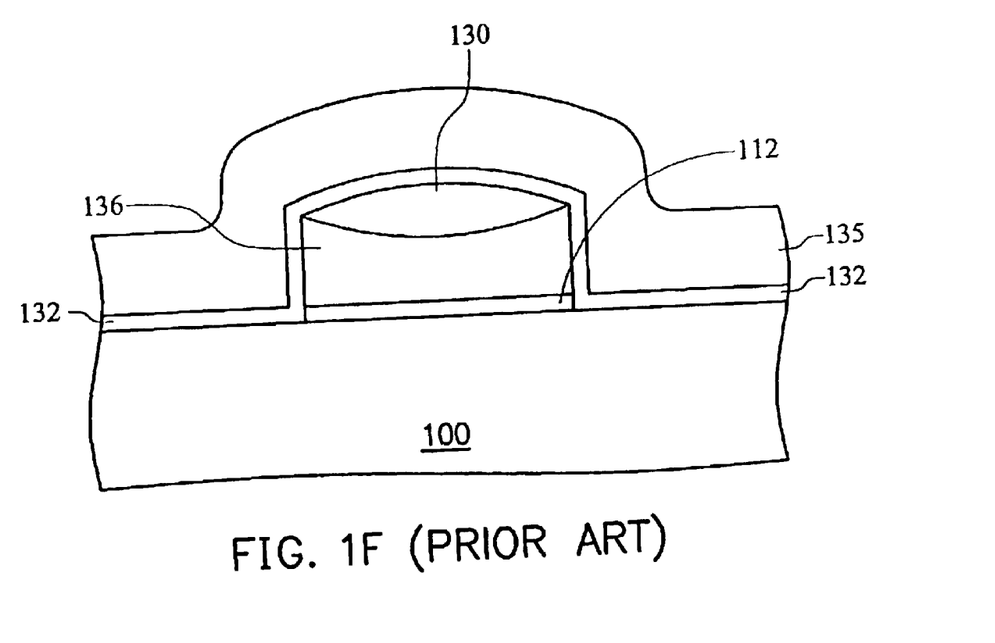

A second conductive layer 135, for example, doped polysilicon, is formed to cover the surface of the second insulating layer 132, as shown in FIG. 1F.

Figure 1G:
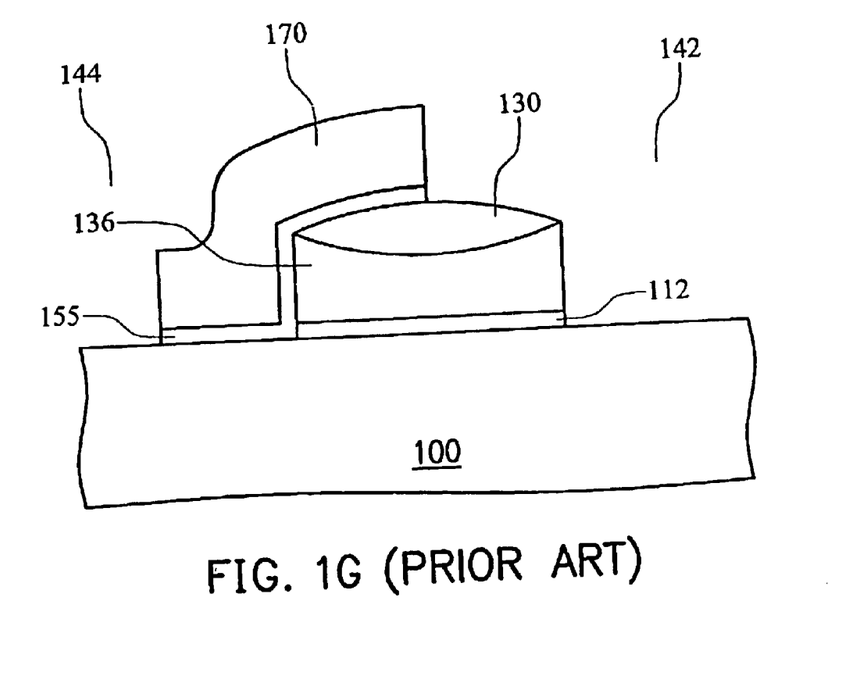

Photolithography and etching are then performed to remove part of the second conductive layer 135 and second insulating layer 132, as shown in FIG. 1G, to form a second opening 142 and a third opening 144. The remaining second conductive layer 135 is the control gate 170 and the remaining second insulating layer 132 is the second gate insulating layer 155.

Figure 1H:
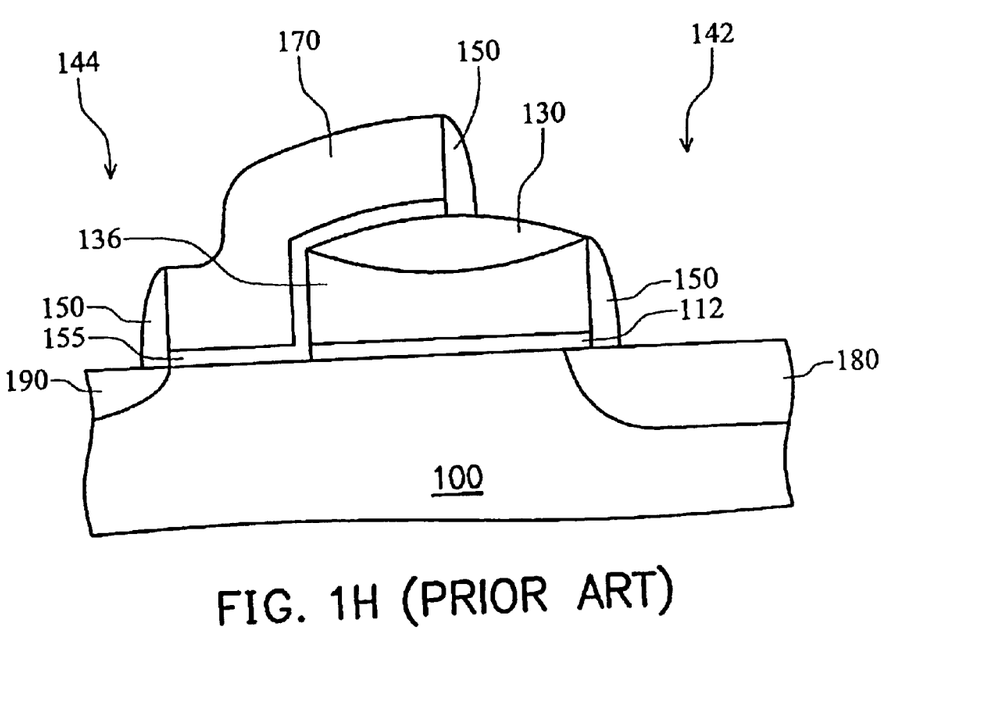

N-type dopants, such as P or Ar, are doped into the substrate 100, as shown in FIG. 1H, to form a source 180 in the substrate 100 within the second opening 142. Next, an oxide layer (not shown) is formed to cover the surface and sidewalls of the floating gate 170, the sidewalls of the second gate insulating layer 155, the surface of the floating gate oxide 130, the floating gate 136 and the sidewalls of the first gate insulating layer 112. Etching is then performed to remove part of the oxide to form insulating spacers 150 on the sidewalls of the second opening 142 and the third opening 143. Then, N-type dopants, such as P or Ar, are doped into the substrate 100 to form a drain 190 in the substrate 100 within the third opening 143. This completes the fabrication of a flash memory cell.

Conventionally, a floating gate oxide is formed on a conductive layer made of doped polysilicon, followed by anisotropic etching to remove the doped polysilicon conductive layer not covered by the floating gate oxide. By doing so, the doped polysilicon conductive layer underneath the floating gate oxide forms the floating gate. When integration of memory increases rapidly, all elements sizes must decrease. Therefore, for traditional methods, sharpness of floating gate tip is no longer satisfactory because of the oxidation used to form a floating gate insulating layer.

SUMMARY OF THE INVENTION

There are three main features for this invention:

1. A conductive layer is formed on the substrate, followed by forming a pad layer on the conductive layer. The pad layer is defined to form an opening, followed by forming a conductive spacer to be used as a poly tip. Next, insulation material is filled to form a gate insulating layer. Using the gate insulating layer as hard mask, the conductive layer not covered by this hard mask is removed, such that the poly tip and the conductive layer underneath together form a floating gate. The formation of the conductive spacer is accomplished by a fully-developed anisotropic etching, thus ensuring the poly tip formed is sharper than the one conventionally made. Process is easier to control as well. Consequently, the method provided in this invention will not be limited by line width.

2. Since the floating gate of the invention is formed by self-alignment, the floating gate can be accurately formed on the active area between shallow trench isolation. Misalignment due to the formation of the floating gate during photolithography will not deviate the floating gate from the predetermined position. In conventional split gate Flash, if the floating gate is not accurately formed in its position, because of misalignment during photolithography, gap occurs between the floating gate and the shallow trench isolation, resulting in dysfunction of the shallow trench isolation.

3. Shallow trench isolation and the first gate insulating layer are formed simultaneously for the method of this invention, simpler than conventional methods.

The invention provides a method for fabricating a flash memory cell, which comprises the following steps: providing a semiconductor substrate; forming a first insulating layer on the substrate; forming a first conductive layer on the first insulating layer; forming pad layer on the first conductive layer; removing part of the pad layer to form a first opening and expose the surface of the first conductive layer; forming a second conductive layer on the surface of the pad layer and sidewalls and bottom of the first opening; removing the second conductive layer covering the surface of the pad layer and the bottom of the first opening, thus the second conductive layer on the sidewalls of the first opening forms the conductive spacer, wherein the spike part on the top of the conductive spacer is the tip; removing sequentially the pad layer, first conductive layer, first insulating layer and substrate to form a second opening; forming a second insulating layer to fill the first opening and the second opening, which forms a first gate insulating layer and shallow trench isolation respectively; removing the remaining pad layer to expose the surface of the first conductive layer; using the first gate insulating layer as hard mask to sequentially remove the first conductive layer and the remaining first insulating layer not covered by the first gate insulating layer and the conductive spacers, and keeping those at the bottom part of the first gate insulating layer and the conductive spacer, wherein the remaining first conductive layer is the floating gate, the remaining first insulating layer is the second gate insulating layer, and the first gate insulating layer, conductive spacers, floating gate and the second gate insulating layer are represented by gate region; forming a third insulating layer to cover the surface of the substrate and the surface and sidewalls of the gate region; forming a third conductive layer to cover the third insulating layer; removing the third conductive layer and the third insulating layer on top and side parts of the gate region to form a third opening, simultaneously forming a fourth opening on the other side of the gate region, wherein the remaining third conductive layer forms a control gate and the remaining third insulating layer forms a tunneling oxide; forming source in the surface of the substrate at the bottom of the third opening; forming a fourth insulating layer to cover the surface of the control gate and evenly covering sidewalls and bottom parts of the third opening and the fourth opening; partially removing the fourth insulating layer and forming insulating spacers on the sidewalls of the third opening and the fourth opening; and forming a drain in the surface of the substrate at the bottom of the fourth opening.

DETAILED DESCRIPTION OF THE INVENTION

Figure 2A:
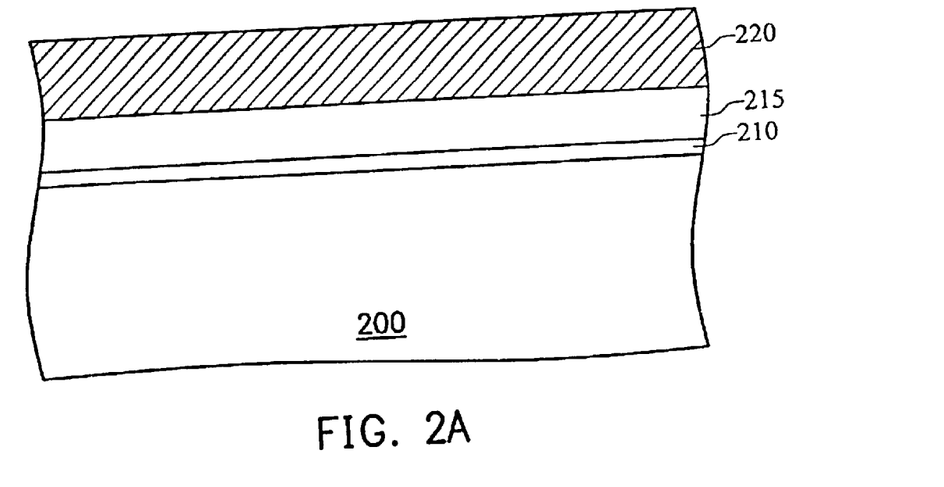
FIGS. 2A~2P are cross-sections of the process of fabricating a flash memory cell according to the method provided in the present invention.
Figure 2B:
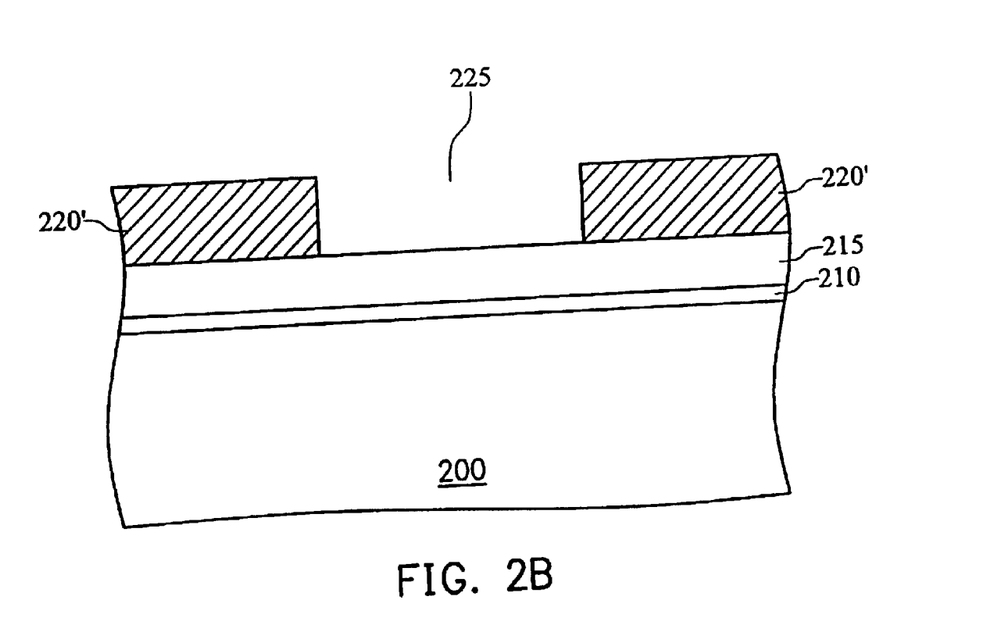
Figure 2C:
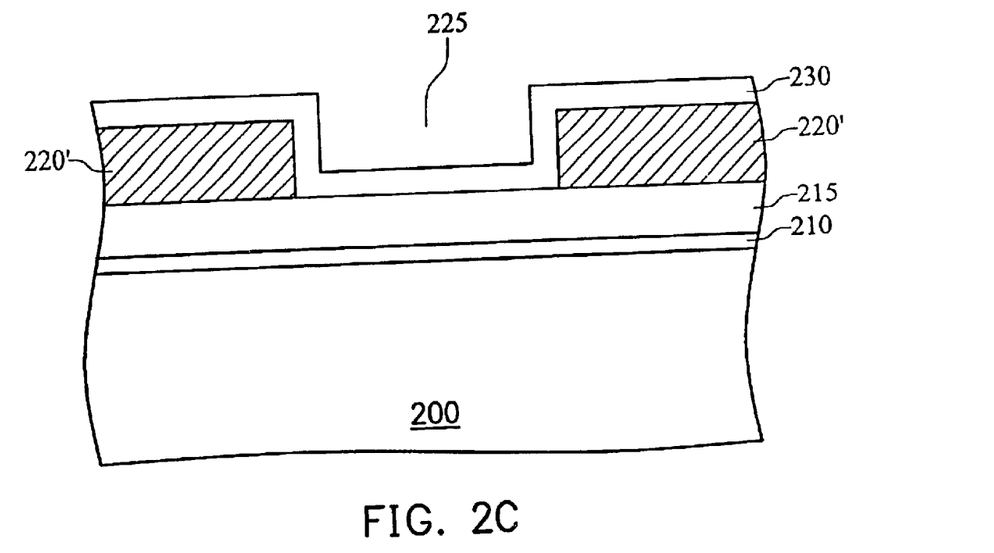
Figure 2D:
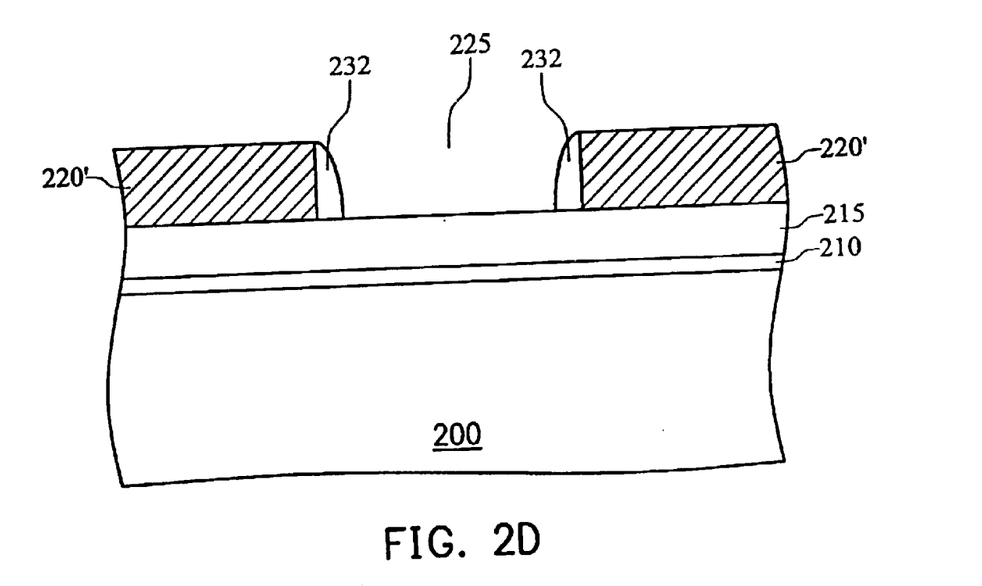
Figure 2E:
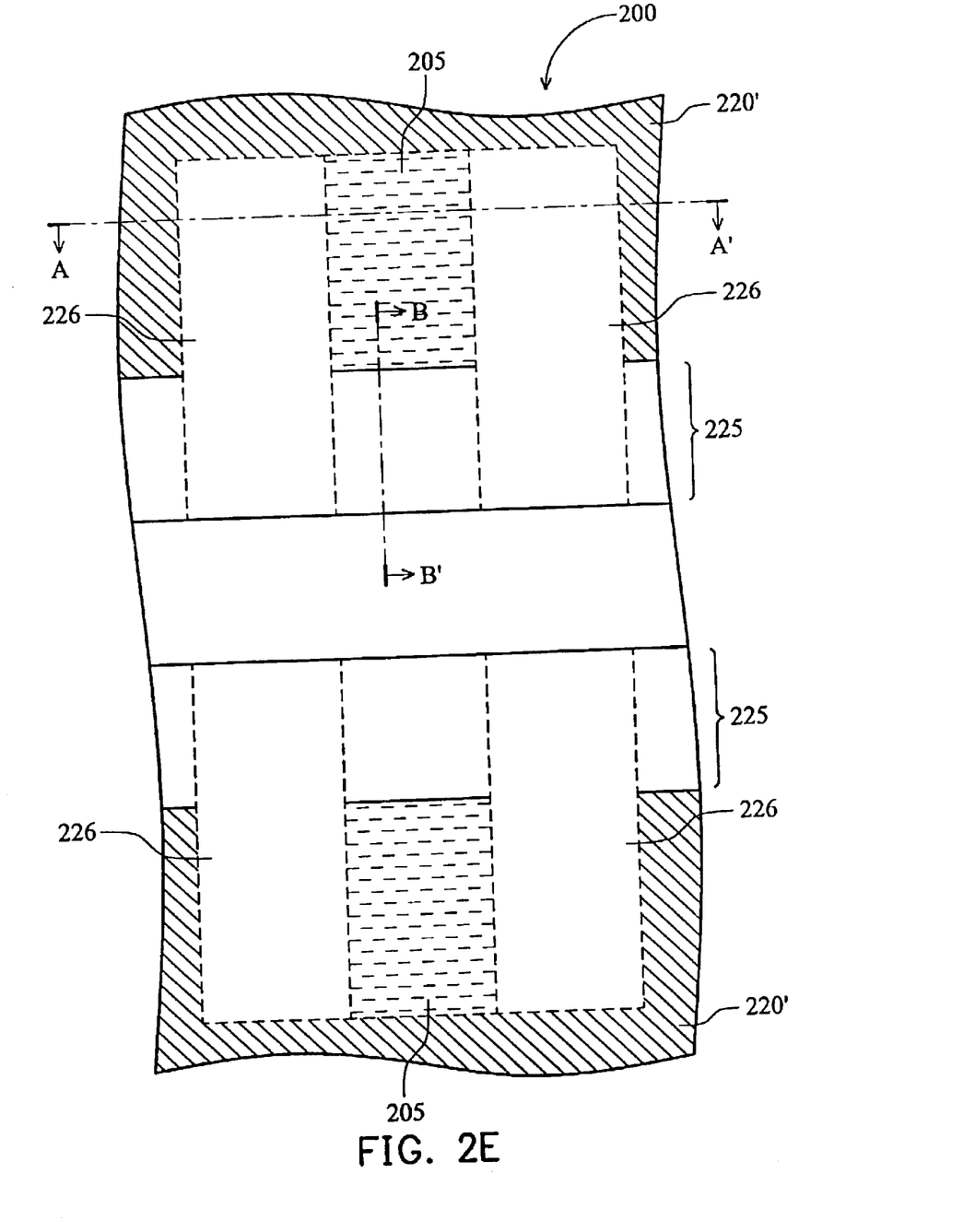
Figure 2F:
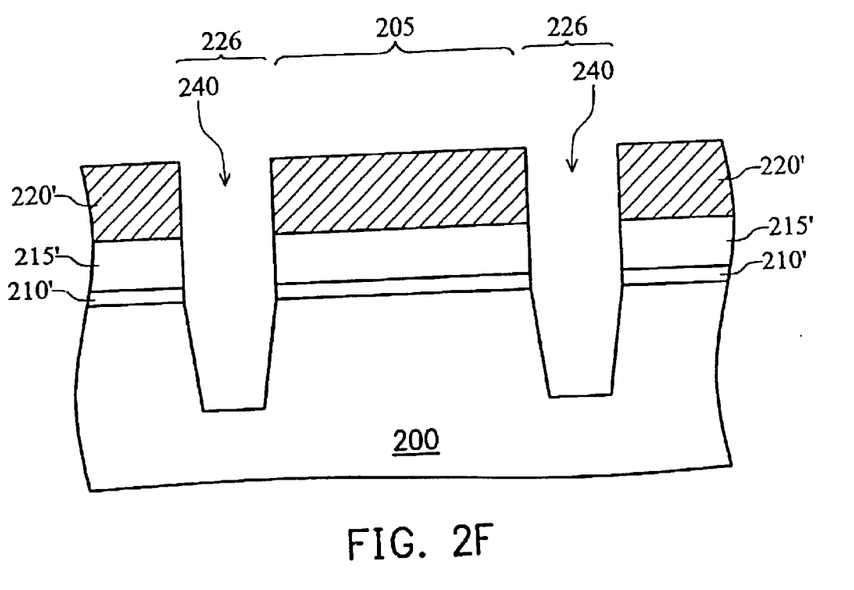
Figure 2G:
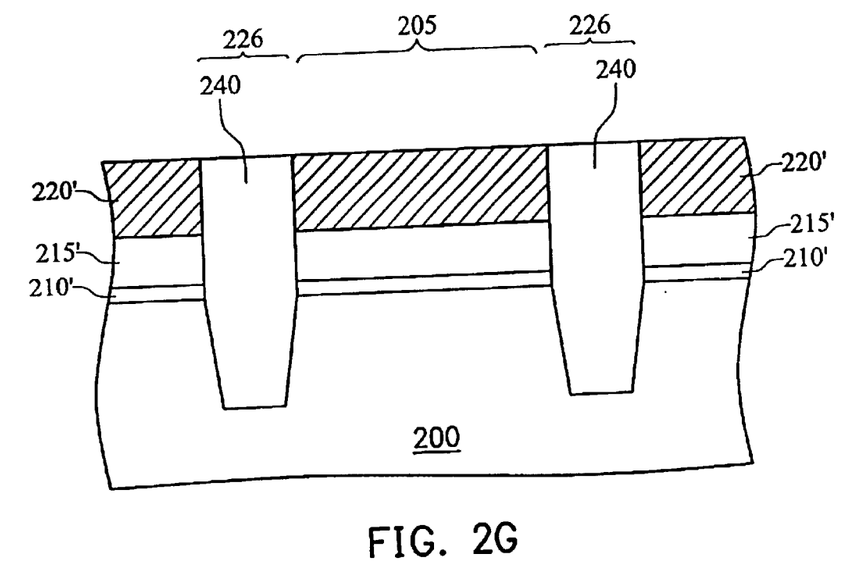
Figure 2H:
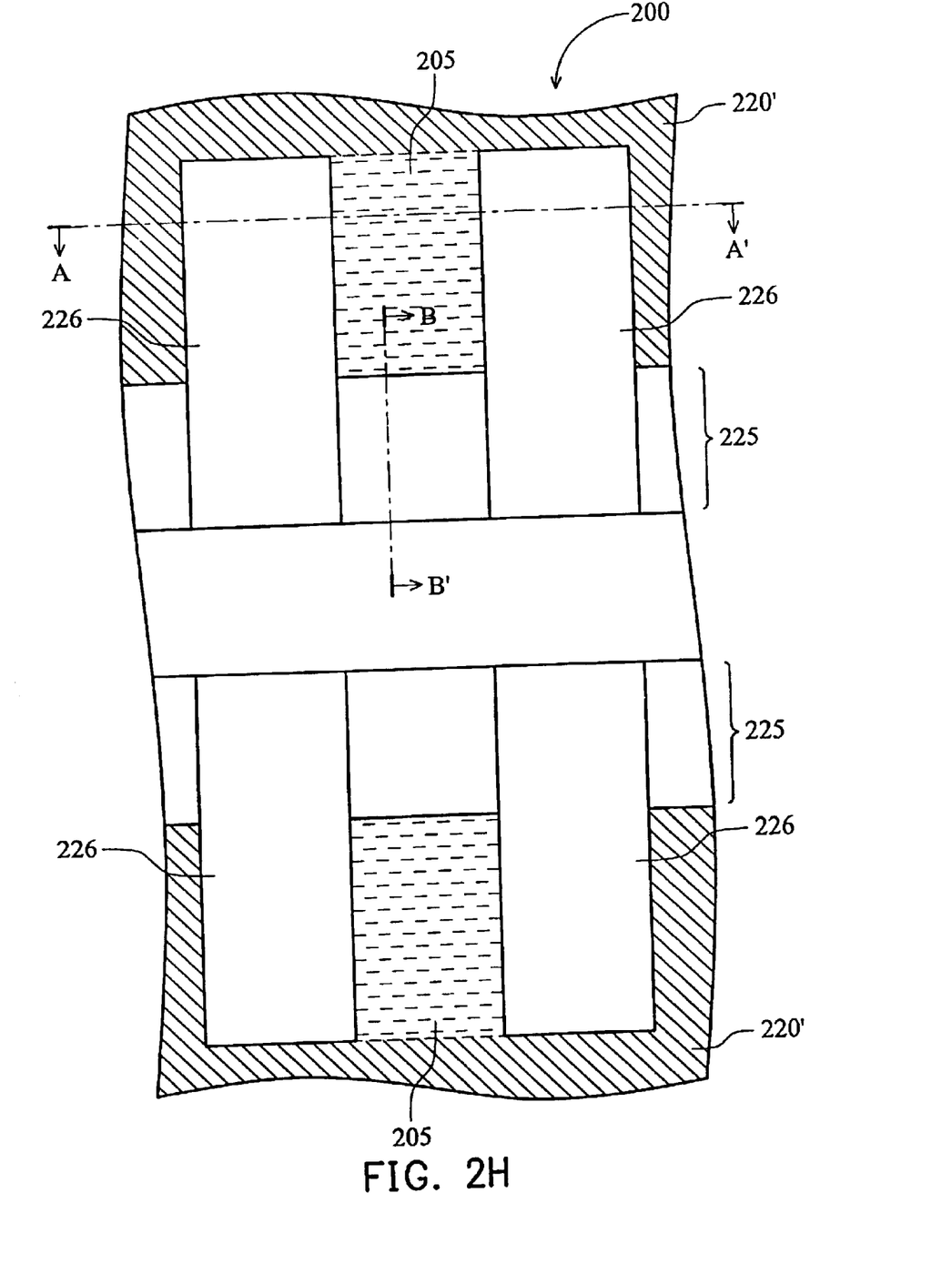
Figure 2I:
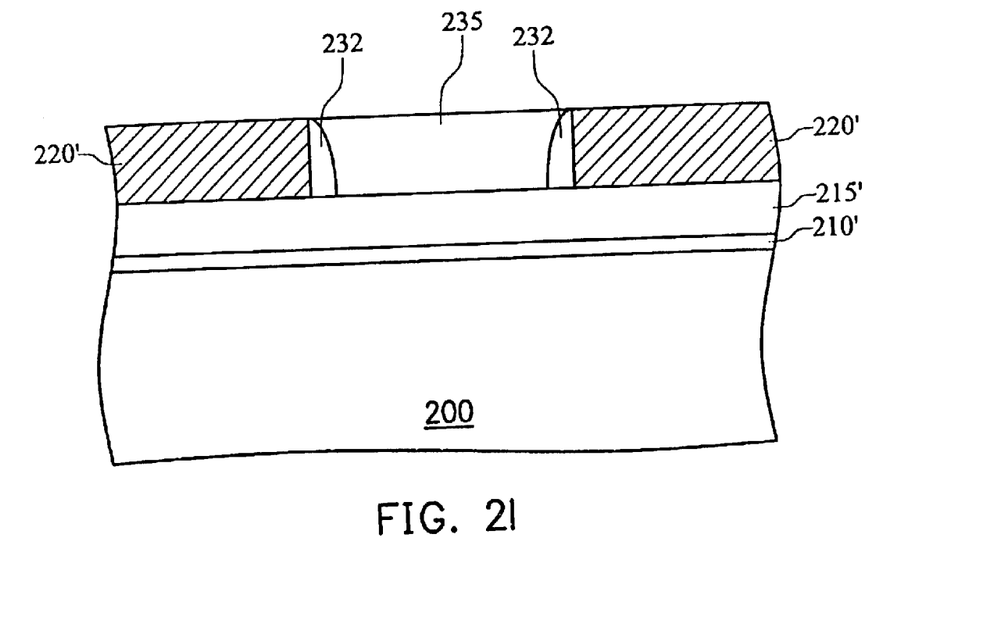
Figure 2J:
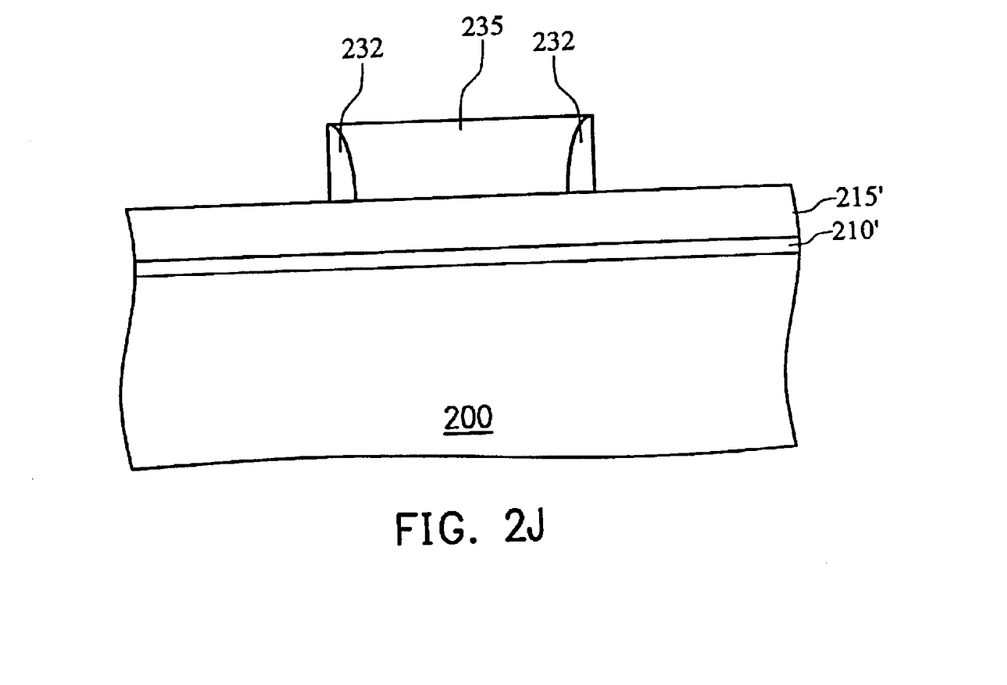
Figure 2K:
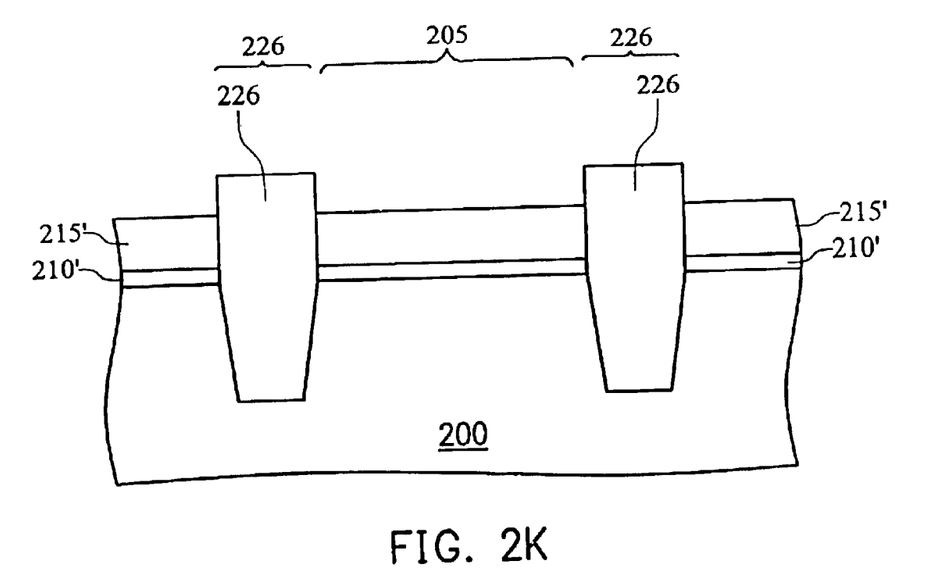
Figure 2L:
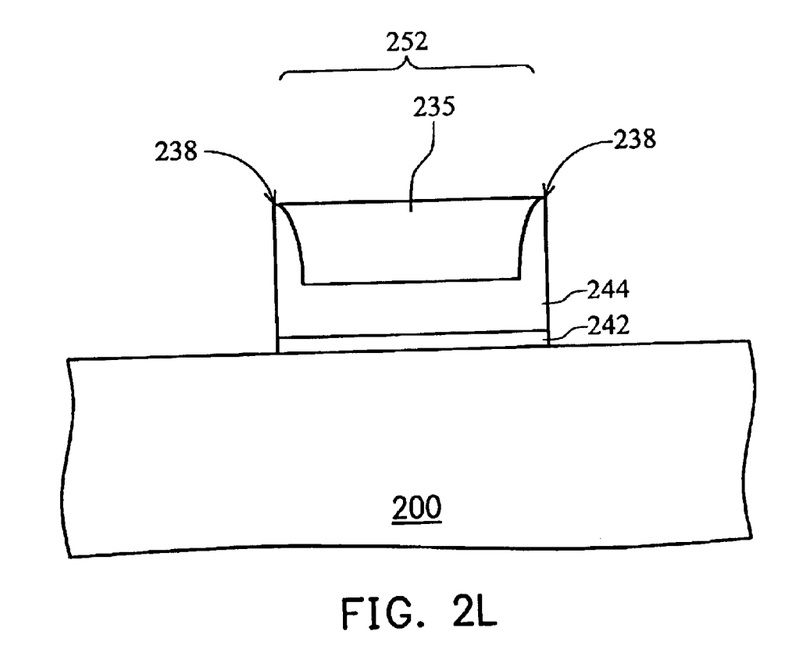
Figure 2M:
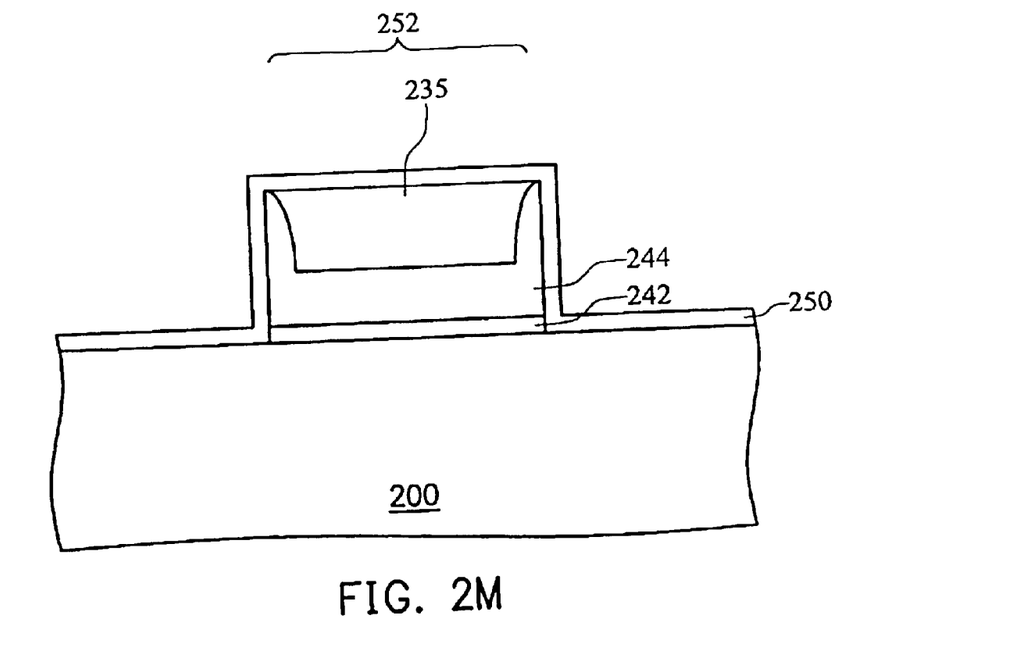
Figure 2N:
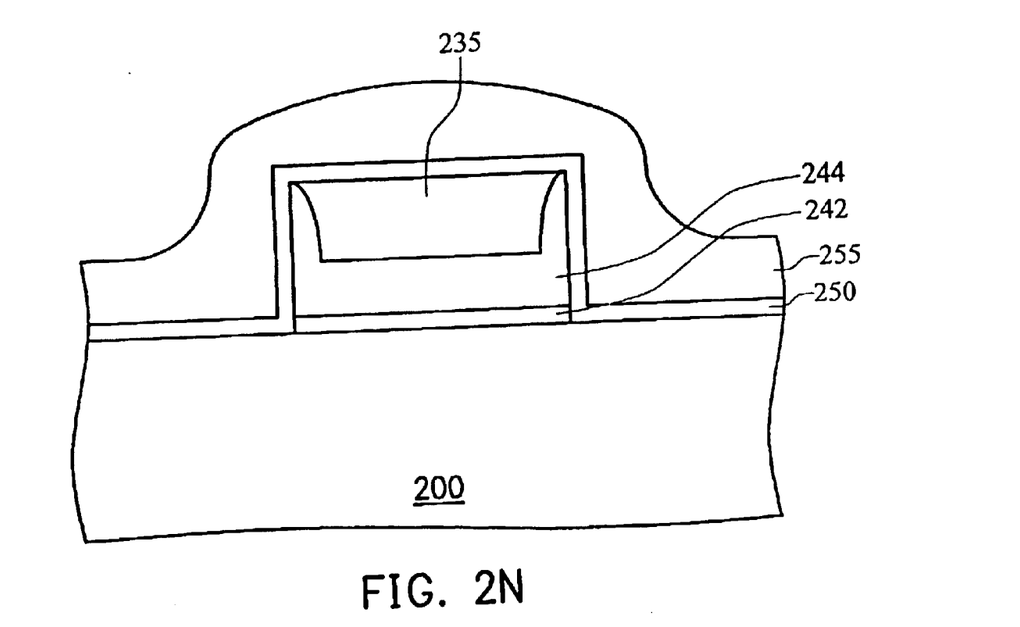
Figure 2O:
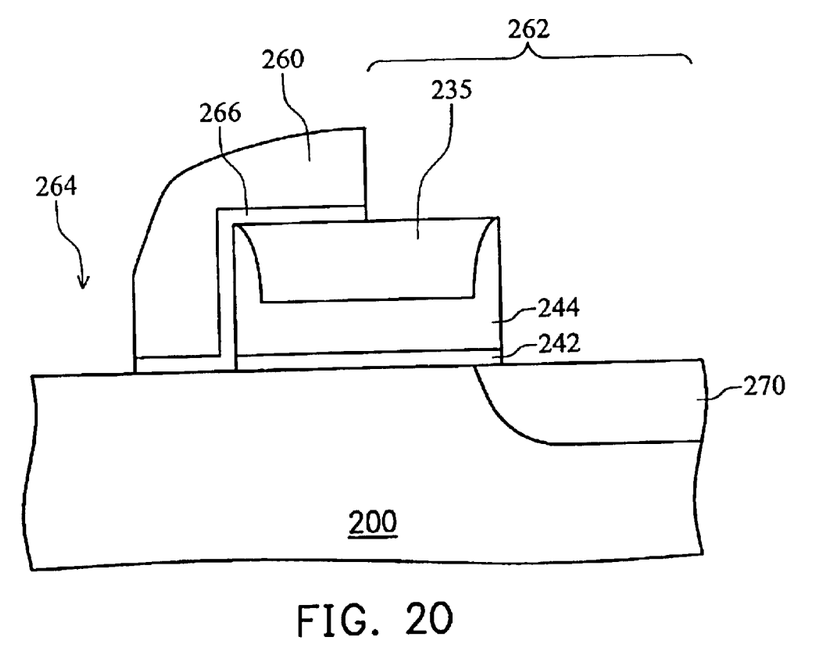
Figure 2P:
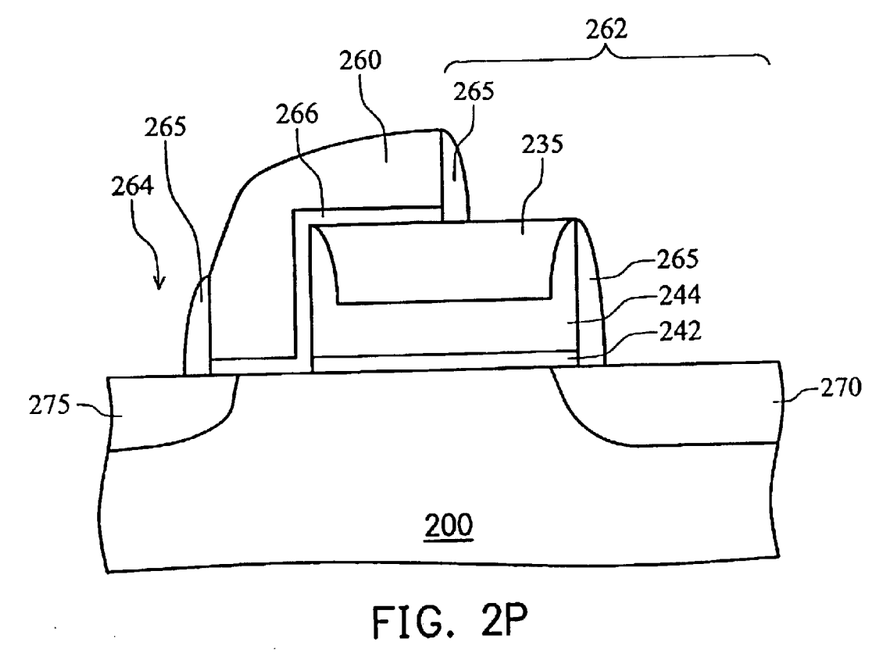

FIGS. 2A~2P are cross-sections of the process of fabricating a flash memory cell according to the method provided in the present invention. In FIG. 2A, substrate 200 is a semiconductor substrate. Using a p-type substrate as an example, a first insulating layer 210 is formed on the surface of the substrate 200. Thickness of the first insulating layer 210, silicon oxide formed by oxidation, is 70~200 Angstroms. Next, a first conductive layer 215, with a thickness of 500~2000 Angstroms, is formed on the surface of the first insulating layer 210. The first conductive layer 215 is polysilicon formed by chemical vapor deposition (CVD). In order to make the first conductive layer 215 conductive, diffusion or ion implantation is performed to dope As ions or P ions. In-situ doping is also applicable to form the doped polysilicon. Then, a pad layer 220 is formed by, for example, low pressure CVD on the first conductive layer 215, with a thickness of 500~3000 Angstroms. This layer can be, for example, silicon nitride. Photolithography and etching are performed to remove part of the pad layer 220 to form a first opening 225, as shown in FIG. 2B. The surface of the first conductive layer 215 is exposed and the remaining pad layer 220 is represented by the remaining pad layer 220'.

A second conductive layer 230 of 50~200 Angstroms thickness is then formed on the surface of the remaining pad layer 220' and the sidewalls and bottom part of the first opening 225, as shown in FIG. 2C. This second conductive layer 230 is polysilicon formed by chemical vapor deposition (CVD). In order to make this layer conductive, diffusion or ion implantation is performed to dope As ions or P ions. In-situ doping is also applicable to form the doped polysilicon.

In FIG. 2D, etching is performed to remove the second conductive layer 230 covering the remaining pad layer 220' and bottom part of the first opening 225. The second conductive layer 230 remaining on the sidewalls of the first opening 225 forms the conductive spacer 232. The sharp tip of the conductive spacer 232 is the tip. Etching accomplished in this step is anisotropic.

FIG. 2E is the top view of the flash memory after the formation of the first opening 225 in FIG. 2B, wherein the relative positions of the first opening 225 and the shallow trench isolation (STI) 226 and the active area 205 which are going to be formed at later stages are shown. FIGS. 2A~2D are cross-sections of the line B–B' in FIG. 2E. Next, a shallow trench isolation 226 is formed on the surface of the substrate 200 to define an active area 205, shown in FIGS. 2F~2H. FIGS. 2F~2G are cross-sections of the line A–A' in FIG. 2E.

In FIG. 2F, photolithography and etching are performed to sequentially remove parts of the pad layer 220, the first conductive layer 215, the first insulating layer 210 and the substrate 200 to form a second opening 240. Etching in this step is anisotropic. The remaining first conductive layer 215 and the first insulating layer 210 are respectively represented by the remaining first conductive layer 215' and the remaining first insulating layer 210'.

A second insulating layer (not shown) is formed on the surface of the remaining pad layer 220' and fills the second opening 240. As shown in FIG. 2G, this second insulating layer is silicon oxide formed by chemical vapor deposition.

The thickness of the second insulating layer is 3000~5000 Angstroms. The second insulating layer on the surface of the remaining pad layer 220' is removed without removing the portion within the second opening 240, which forms the shallow trench isolation 226.

FIG. 2H is a the layout of the flash memory after FIG. 2G, wherein relative positions of the shallow trench isolation 226, the first opening 225, and the active area 205 located between shallow trench isolation 226.

FIG. 2I is a cross-section according to the line B–B' in FIG. 2H. It is the same step as in FIG. 2G. The second insulating layer (not shown) formed on the surface of the remaining pad layer 220' simultaneously fills the first opening 225. Next, the second insulating layer on the surface of the remaining pad layer 220' is removed without removing the portion within the first opening 225, which forms the first gate insulating layer 235. After the formation of the second insulating layer, a first gate insulating layer 235 and the shallow trench isolation can be formed simultaneously.

Etching is then performed to remove all the remaining pad layer 220', as shown in FIG. 2J, and the surface of the remaining first conductive layer 215' is exposed.

FIG. 2K is a the cross-section of the line A–A' in FIG. 2H. FIG. 2K illustrates the same step of FIG. 2J. After FIG. 2K, the remaining pad layer 220' is completely removed to expose the remaining first conductive layer 215' and the shallow trench isolation 226.

The first gate insulating layer 235 is used as a hard mask, as shown in FIG. 2L, wherein etching is performed to sequentially remove the remaining first conductive layer 215' and the remaining first insulating layer 210' not covered by the first gate insulating layer 235 and the conductive spacer 232. The portions underneath the first gate insulating layer 235 and the conductive spacer 232 remain. The remaining first conductive layer 215' and the tip 232 are combined to form a floating gate 244. The remaining first insulating layer 210' is the second gate insulating layer 242. For easy reference, the first gate insulating layer 235, the conductive spacer 232, the floating gate 244 and the second gate insulating layer 242 are represented by a gate region 252. The tip of the conductive spacer 232 is the poly tip 238. In the present invention, spacer forms the poly tip, sharper and easier to form than in the prior art.

In FIG. 2M, a third insulating layer 250 is formed to cover the surface of the substrate 200 and the surface and sidewalls of the gate region 252. The third insulating layer 250 is silicon oxide formed by chemical vapor deposition with a thickness of 100~250 Angstroms.

Next, a third conductive layer 255 with thickness of 1000~2500 Angstroms is formed to cover the third insulating layer 250, as shown in FIG. 2N. The third conductive layer 255 is doped polysilicon, formed by diffusion or ion implantation with As ions or P ions into a layer of polysilicon formed by low pressure CVD. In-situ doping is also applicable to form the doped polysilicon. The doped polysilicon is used as a conductive layer.

Photolithography and etching are then performed, as shown in FIG. 2O, where the upper part of the gate region 252, part of the conductive layer 255 located on the sidewalls of the gate region and the third insulating layer 250 are removed to form a third opening 262. Simultaneously, part of the third conductive layer 255 and the third insulating layer 250 are removed to form a fourth opening 264 on the other side of the gate region 252. Consequently, the remaining third conductive layer 255 forms the floating gate 260, and the remaining third insulating layer 250 forms the tunneling oxide 266. Next, source 270 is formed on the surface of the substrate 200 within the third opening 262.

A fourth insulating layer (not shown) is formed to cover the surface of the control gate 260, which evenly covers the sidewalls and bottom parts of the third opening 262 and the fourth opening 264. The thickness of the fourth insulating layer, silicon oxide formed by chemical vapor deposition, is 200~2000 Angstroms. As shown in FIG. 2P, etching is performed to remove part of the fourth insulating layer to form an insulating spacer 265 on the sidewalls of the third opening 262 and the fourth opening 264. Then, a drain 275 is formed in the surface of the substrate 200 within the fourth opening 264. This accomplishes the fabrication of a flash memory cell.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a flash memory cell, comprising:

providing a semiconductor substrate;

forming a first insulating layer on the substrate;

forming a first conductive layer on the first insulating layer;

forming a pad layer on the first conductive layer;

removing part of the pad layer to form a first opening and expose the surface of the first conductive layer;

forming a second conductive layer on the surface of the pad layer and the sidewalls and bottom part of the first opening;

removing the second conductive layer covering the surface of the pad layer and the bottom part of the first opening, wherein the second conductive layer on the sidewalls of the first opening forms the conductive spacer, wherein the spike part on the top of the conductive spacer is the tip;

sequentially removing the pad layer, first conductive layer, first insulating layer and substrate to form a second opening;

forming a second insulating layer to fill the first opening and the second opening, which forms a first gate insulating layer and shallow trench isolation respectively;

removing the remaining pad layer to expose the surface of the first conductive layer;

using the first gate insulating layer as a hard mask to sequentially remove the first conductive layer and the remaining first insulating layer not covered by the first gate insulating layer and the conductive spacers, and keeping those at the bottom part of the first gate insulating layer and the conductive spacer, wherein the remaining first conductive layer is the floating gate, the remaining first insulating layer is the second gate insulating layer, and the first gate insulating layer, conductive spacers, floating gate and the second gate insulating layer are represented by gate region;

forming a third insulating layer to cover the surface of the substrate and the surface and sidewalls of the gate region;

forming a third conductive layer to cover the third insulating layer;

removing the third conductive layer and the third insulating layer on the top and side parts of the gate region to form a third opening, simultaneously forming a fourth opening on the other side of the gate region, wherein the remaining third conductive layer forms a control gate and the remaining third insulating layer forms a tunneling oxide;

forming a source in the surface of the substrate at the bottom of the third opening;

forming a fourth insulating layer to cover the surface of the control gate and covering evenly sidewalls and bottom parts of the third opening and the fourth opening;

partially removing the fourth insulating layer and forming insulating spacers on the sidewalls of the third opening and the fourth opening; and forming a drain in the surface of the substrate at the bottom of the fourth opening.

2. The method as claimed in claim 1, wherein the semiconductor substrate is silicon substrate.

3. The method as claimed in claim 2, wherein the first conductive layer is doped polysilicon.

4. The method as claimed in claim 1, wherein the thickness of the first conductive layer is 500~2000 Å.

5. The method as claimed in claim 1, wherein the second conductive layer is doped polysilicon.

6. The method as claimed in claim 1, wherein the thickness of the second conductive layer is 50~200 Å.

7. The method as claimed in claim 1, wherein the pad layer is silicon nitride.

8. The method as claimed in claim 1, wherein the thickness of the pad layer is 500~3000 Å.

9. The method as claimed in claim 1, wherein the first insulating layer is silicon oxide.

10. The method as claimed in claim 1, wherein the thickness of the first insulating layer is 70~200 Å.

11. The method as claimed in claim 1, wherein the second insulating layer is silicon oxide.

12. The method as claimed in claim 1, wherein the thickness of the first insulating layer is 70~200 Å.

13. The method as claimed in claim 1, wherein the third insulating layer is silicon oxide.

14. The method as claimed in claim 1, wherein the thickness of the third insulating layer is 100~250 Å.

15. The method as claimed in claim 1, wherein the fourth insulating layer is silicon oxide.

16. The method as claimed in claim 1, wherein the thickness of the fourth insulating layer is 200~2000 Å.

* * * * *